(12) United States Patent
Kang

(10) Patent No.: US 9,245,806 B2
(45) Date of Patent: Jan. 26, 2016

(54) SEMICONDUCTOR DEVICE WITH TRANSISTOR AND METHOD OF FABRICATING THE SAME

(71) Applicant: SK hynix Inc., Gyeonggi-do (KR)

(72) Inventor: Dong-Kyun Kang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/326,154

(22) Filed: Jul. 8, 2014

(65) Prior Publication Data

US 2015/0221559 A1    Aug. 6, 2015

(30) Foreign Application Priority Data

Feb. 5, 2014    (KR) .................. 10-2014-0013033

(51) Int. Cl.
| | | |
|---|---|---|
| H01L 21/338 | (2006.01) | |
| H01L 29/76 | (2006.01) | |
| H01L 21/8238 | (2006.01) | |
| H01L 21/28 | (2006.01) | |
| H01L 27/092 | (2006.01) | |
| H01L 29/49 | (2006.01) | |

(52) U.S. Cl.
CPC .. *H01L 21/823842* (2013.01); *H01L 21/28008* (2013.01); *H01L 27/092* (2013.01); *H01L 29/4966* (2013.01)

(58) Field of Classification Search
CPC .................. H01L 21/823462; H01L 21/8238; H01L 21/823842; H01L 21/823857; H01L 29/4966; H01L 21/28008; H01L 27/092
USPC .......................... 438/169, 199, 216, 215, 287; 257/402–407
See application file for complete search history.

(56) References Cited

U.S. PATENT DOCUMENTS

2005/0280104 A1* 12/2005 Li .................................. 257/406
2010/0044798 A1*  2/2010 Hooker et al. ................. 257/369

* cited by examiner

*Primary Examiner* — Kevin M Picardat
(74) *Attorney, Agent, or Firm* — IP & T Group LLP

(57) ABSTRACT

A method of fabricating a semiconductor device that includes forming a gate stack layer including a metal-containing layer on a semiconductor substrate having an NMOS region and a PMOS region, introducing arsenic to the gate stack layer in the NMOS region, introducing aluminum to the gate stack layer in the PMOS region, and etching the gate stack layers, where the arsenic and the aluminum are introduced, to form a first gate structure and a second gate structure in the NMOS region and the PMOS region, respectively.

19 Claims, 11 Drawing Sheets

SEMICONDUCTOR DEVICE WITH TRANSISTOR AND METHOD OF FABRICATING THE SAME

CROSS-REFERENCE TO RELATED APPLICATIONS

The present application claims priority of Korean Patent Application No. 10-2014-0013033, filed on Feb. 5, 2014, which is incorporated herein by reference in its entirety.

BACKGROUND

1. Field

Various exemplary embodiments of the present invention relate to a semiconductor device and, more particularly, to a semiconductor device with a transistor and a method of fabricating the same.

2. Description of the Related Art

As transistors in a semiconductor device are scaled down to improve performance, the gate dielectric layer gets thinner and gate leakage increases. To address this concern, the gate dielectric layer is replaced with a high-k material having a dielectric constant greater than the dielectric constant of silicon dioxide ($SiO_2$). The high-k material may include a metal oxide containing hafnium, zirconium, etc. As the high-k material is introduced, a Fermi level pinning effect is caused by the contact between the high-k material and a polysilicon gate electrode. The Fermi level pinning effect is a characteristic of the interface between the polysilicon gate electrode and the metal oxide, and it increases the threshold voltage of a transistor.

Recently, a gate structure including a high-k material and a metal gate electrode have been utilized to address the Fermi level pinning effect. However, during the CMOS device fabrication process it may be difficult to form a metal gate electrode having an N-type work function and a P-type work function, which require an appropriate threshold voltage Vt for each transistor. Although a metal gate electrode having an appropriate work function for each transistor is formed, the work function of the gate structure may fluctuate due to the materials of the gate dielectric layer that contact the metal gate electrode, and various other factors originating from the gate stack formation process, such as an etch process and a high-temperature thermal process.

SUMMARY

Exemplary embodiments of the present invention are directed to a semiconductor device with a CMOS transistor, in which the threshold voltage of an N-channel transistor and the threshold voltage of a P-channel transistor may be independently controlled, and a method of fabricating the same.

In accordance with an embodiment of the present invention, a method of fabricating a semiconductor device includes forming a gate stack layer including a metal-containing layer on a semiconductor substrate having an NMOS region and a PMOS region, introducing arsenic to the gate stack layer in the NMOS region, introducing aluminum to the gate stack layer in the PMOS region, and etching the gate stack layers, where the arsenic and the aluminum are introduced to form a first gate structure and a second gate structure in the NMOS region and the PMOS region, respectively.

In accordance with another embodiment of the present invention, a method of fabricating a semiconductor device includes preparing a semiconductor substrate having an NMOS region and a PMOS region, forming a germanium-containing channel region in an upper portion of the semiconductor substrate of the PMOS region, forming a first gate stack layer including a first high-k layer, a capping layer, and a first metal-containing layer over the semiconductor substrate of the NMOS region, forming a second gate stack layer including a second high-k layer and a second metal-containing layer over the semiconductor substrate of the PMOS region, introducing arsenic to the first gate stack layer, introducing aluminum to the second gate stack layer, and etching the arsenic-introduced first gate stack layer and the aluminum-introduced second gate stack layer to form a first gate structure and a second gate structure in the NMOS region and the PMOS region, respectively.

In accordance with another embodiment of the present invention, a semiconductor device includes an N-channel transistor having a first gate structure, a P-channel transistor having a second gate structure, and a germanium-containing channel region formed below the second gate structure. The first gate structure includes a first high-k layer, a capping layer including a lanthanum oxide over the first high-k layer, a first metal gate electrode over the capping layer and arsenic ions disposed at an interface between the capping layer and the first metal gate electrode. The second gate structure includes a second high-k layer, a second metal gate electrode over the second high-k layer, and aluminum ions disposed at an interface between the second high-k layer and the second metal gate electrode.

DETAILED DESCRIPTION

Figure 1:
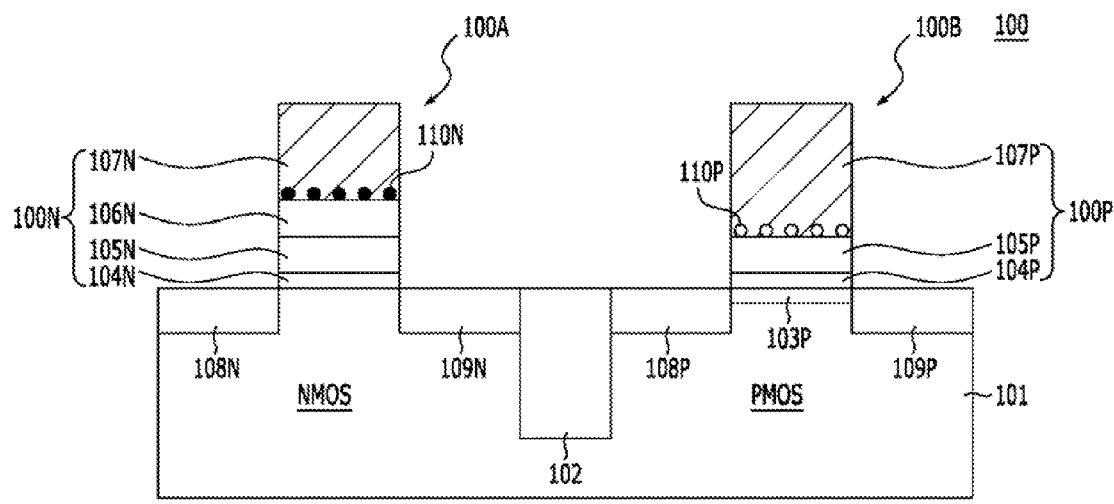
FIG. 1 is a cross-sectional view illustrating a semiconductor device in accordance with a first embodiment of the present invention.

Various examples and implementations of the disclosed technology are described below in detail with reference to the accompanying drawings.

The drawings may not be necessarily to scale and, in some instances, proportions of structures in the drawings may have been exaggerated to clearly illustrate certain features of the examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a cross-sectional view illustrating a semiconductor device 100 in accordance with a first embodiment of the present invention.

Referring to FIG. 1, the semiconductor device 100 includes a first transistor 100A and a second transistor 100B. The first transistor 100A may be an N-channel transistor (or an NMOSFET) 'NMOS'. The second transistor 100B may be a P-channel transistor (or a PMOSFET) 'PMOS'. The first transistor 100A and the second transistor 100B are isolated from each other by an isolation region 102.

The first transistor 100A includes a first gate structure 100N, a first source region 108N, and a first drain region 109N. The first gate structure 100N is formed over a substrate 101. The first source region 108N and the first drain region 109N are formed in the substrate 101. The first gate structure 100N includes a first interfacial layer 104N, a first high-k layer 105N, a capping layer 106N, and a first metal gate electrode 107N.

A first chemical species 110N is introduced to the first gate structure 100N. The first chemical species 110N may include arsenic (As). The electronegativity of the arsenic (As) is approximately 2.18, which is relatively high. The work function is closely related to the electronegativity. As arsenic ions are introduced, the work function is controlled. The first chemical species 110N may be disposed at an interface between the first metal gate electrode 107N and the capping layer 106N. Also, the first chemical species 110N may be disposed in the first high-k layer 105N, the capping layer 106N and the first metal gate electrode 107N. The threshold voltage of the first transistor 100A is controlled by the work function of the first chemical species 110N. Furthermore, a dipole is formed in a predetermined direction in the first high-k layer 105N by the first chemical species 110N and the capping layer 106N, and thus the threshold voltage may be controlled.

The first metal gate electrode 107N includes a low-resistance material. The first metal gate electrode 107N may include a metal-containing material. For example, the first metal gate electrode 107N may include a titanium nitride having a chemical stoichiometric ratio. The chemical stoichiometric ratio of titanium and nitrogen is approximately one to one (1:1). The work function of the first metal gate electrode 107N may be controlled as the first chemical species 110N is introduced. For example, the first metal gate electrode 107N may have an N-type work function from the first chemical species 110N. The N-type work function is smaller than the mid-gap work function of silicon. As the first chemical species 110N is introduced, the work function may be decreased.

The second transistor 100B includes a germanium-containing channel region 103P, a second gate structure 100P, a second source region 108P, and a second drain region 109P. The second gate structure 100P is formed over the substrate 101. The second source region 108P and the second drain region 109P are formed in the substrate 101. The second gate structure 100P includes a second interfacial layer 104P, a second high-k layer 105P, and a second metal gate electrode 107P. The germanium-containing channel region 103P is formed below the second gate structure 100P in the substrate 101. The germanium-containing channel region 103P is disposed between the second source region 108P and the second drain region 109P.

A second chemical species 110P is introduced to the second gate structure 100P. The second chemical species 110P may include aluminum (Al). The electronegativity of aluminum (Al) is approximately 1.6, which is relatively low. As aluminum ions are introduced, the work function is controlled. The second chemical species 110P may be disposed at an interface between the second metal gate electrode 107P and the second high-k layer 105P. Also, the second chemical species 110P may be disposed in the second high-k layer 105P and the second metal gate electrode 107P. The threshold voltage of the second transistor 100B is controlled based on the work function of the second chemical species 110P. Also, the threshold voltage may be additionally controlled through a dipole that is induced by the second chemical species 110P. The threshold voltage of the second transistor 100B is further controlled by the germanium-containing channel region 103P.

The second metal gate electrode 107P includes a low-resistance material. The second metal gate electrode 107P may include a metal-containing material. The first metal gate electrode 107N and the second metal gate electrode 107P may include the same metal-containing material. For example, the second metal gate electrode 107P may include a titanium nitride having a chemical stoichiometric ratio. The work function of the second metal gate electrode 107P may be controlled as the second chemical species 110P is introduced. For example, the second metal gate electrode 107P has a P-type work function from the second chemical species 110P. The P-type work function is higher than the mid-gap work function of silicon. As the second chemical species 110P is introduced, the work function may increase.

The first interfacial layer 104N and the second interfacial layer 104P may include the same material. The first interfacial layer 104N and the second interfacial layer 104P may include a silicon oxide or a silicon oxynitride. For example, the first interfacial layer 104N and the second interfacial layer 104P may include a silicon dioxide ($SiO_2$) or a silicon oxynitride (SiON). The first interfacial layer 104N and the second interfacial layer 104P improve the carrier mobility characteristics by improving the interfacial characteristics between the substrate 101, the first high-k layer 105N and the second high-k layer 105P.

The first high-k layer 105N and the second high-k layer 105P may include the same material. The first high-k layer 105N and the second high-k layer 105P may include a material having a high-k constant. The dielectric constants of the first high-k layer 105N and the second high-k layer 105P are higher than the dielectric permittivity of silicon dioxide ($SiO_2$), which is approximately 3.9. The first high-k layer 105N and the second high-k layer 105P may have a higher dielectric constant than the first interfacial layer 104N and the second interfacial layer 104P. The first high-k layer 105N and the second high-k layer 105P may include a metal oxide, a metal silicate or a metal silicate nitride. The first high-k layer 105N and the second high-k layer 105P may contain a metal such as hafnium (Hf), aluminum (Al), lanthanum (La), zirconium (Zr), etc. The first high-k layer 105N and the second high-k layer 105P may include a hafnium oxide, an aluminum oxide, a lanthanum oxide, a zirconium oxide or a combination thereof. The first high-k layer 105N and the second high-k layer 105P may include hafnium silicate (HfSiO), zirconium silicate (ZrSiO) or a combination thereof. The first high-k layer 105N and the second high-k layer 105P may include a hafnium silicate nitride (HfSiON), a zirconium silicate nitride (ZrSiON), or a combination thereof.

The capping layer 106N may include material containing a third chemical species. The threshold voltage of the first transistor 100A may be further controlled by the third chemical species. A dipole interface may be formed by the third chemical species. For example, the dipole interface is formed on the interface between the first interfacial layer 104N and the first high-k layer 105N. The third chemical species may include a lanthanide element. The capping layer 106N may include a lanthanum oxide.

Although not illustrated, a low resistance layer may be formed over the first metal gate electrode 107N and the second metal gate electrode 107P, respectively. The low resistance layer may include a metal silicide. The low resistance layer reduces resistance of the first gate structure 100N and the second gate structure 100P. The low resistance layer may include a silicide layer containing platinum and nickel.

The first source and drain regions 108N and 109N may be doped with an N-type impurity. The second source and drain regions 108P and 109P may be doped with a P-type impurity.

According to FIG. 1, the threshold voltage of the first transistor 100A is controlled by the first gate structure 100N where the first chemical species 110N is introduced. The first gate structure 100N where the first chemical species 110N is introduced controls the threshold voltage easier than the first gate structure 100N where the first chemical species 110N is not introduced.

The threshold voltage of the second transistor 100B is controlled by the second gate structure 100P where the second chemical species 110P is introduced. The second gate structure 100P where the second chemical species 110P is introduced controls the threshold voltage easier than the second gate structure 100P where the second chemical species 110P is not introduced.

As a result, the threshold voltages of the first transistor 100A and the second transistor 100B may be independently controlled.

FIGS. 2A to 2G are cross-sectional views exemplarily illustrating a method of fabricating the semiconductor device shown in FIG. 1.

Figure 2A:
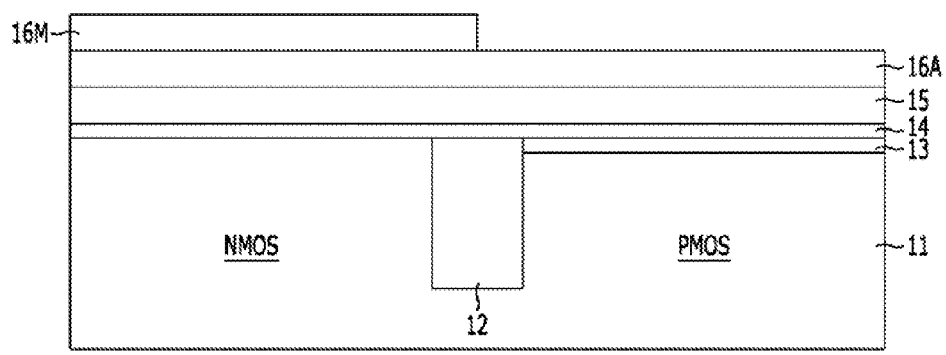
FIGS. 2A to 2G are cross-sectional views exemplarily illustrating a method of fabricating the semiconductor device shown in FIG. 1.

Referring to FIG. 2A, a substrate 11 is prepared. The substrate 11 may include a plurality of transistor regions. One or more transistors are formed in each transistor region. The transistor regions may include a PMOS region 'PMOS' and an NMOS region 'NMOS'. The substrate 11 may include a semiconductor substrate, such as a silicon substrate, a silicon germanium substrate, and a silicon on insulator (SOI) substrate.

An isolation region 12 is formed in the substrate 11. The isolation region 12 may be formed through a shallow trench isolation (STI) process. For example, the substrate 11 is etched to a predetermined depth by using an isolation mask (not shown). To this end, an isolation trench is formed. The isolation region 12 is formed by gap-filling the isolation trench with an insulating material. The isolation region 12 may be formed by sequentially forming a sidewall oxide, a liner and a gap-fill insulating material. The liner may be formed by stacking a silicon nitride and a silicon oxide. The gap-fill insulating material may include a silicon oxide such as a spin on dielectric (SOD), etc. In another embodiment of the present invention, the silicon oxide may be used as the gap-fill insulating material.

A germanium-containing layer 13 is formed. The germanium-containing layer 13 is selectively formed over the substrate 11 in the PMOS region. The germanium-containing layer 13 includes an epitaxial layer including germanium. The germanium-containing layer 13 may be formed by stacking a silicon germanium (SiGe) epitaxial layer and a silicon (Si) epitaxial layer. After recessing a surface of the substrate 11 in the PMOS region to a predetermined depth, the germanium-containing layer 13 may be formed through an epitaxial growth process. In another embodiment of the present invention, the germanium-containing layer 13 may selectively grow over the substrate 11 in the PMOS region without recessing the surface of the substrate 11. The respective thickness of the silicon germanium epitaxial layer and the silicon epitaxial layer in the germanium-containing layer 13 is less than approximately 100 Å. The density of germanium of the silicon germanium epitaxial layer is controlled to be less than approximately 40%. The germanium-containing layer 13 is formed to serve with a channel in the PMOS region.

An interfacial layer 14 is formed over the substrate 11. A high-k layer 15 is formed over the interfacial layer 14. The interfacial layer 14 and the high-k layer 15 may be formed of the same material in the PMOS region and the NMOS region. Before the interfacial layer 14 is formed, a cleaning process may be performed. The cleaning process is performed using a solution including hydrofluoric (HF) acid. A native oxide on the surface of the substrate 11 is removed by performing the cleaning process. Additionally, a dangling bond on the surface of the substrate 11 is passivated with hydrogen so that the native oxide is restrained from growing until a subsequent process is performed.

The interfacial layer 14 may include a silicon oxide or a silicon oxynitride. The interfacial layer 14 may be formed through a thermal oxidation process or a wet oxidation process. The wet oxidation process is performed using ozone ($O_3$). When the interfacial layer 14 is formed through the wet oxidation process using ozone, and the high-k layer 15 is formed of hafnium silicate (HfSiO), hafnium silicate (HfSiO) containing abundant hafnium may be formed while the high-k layer 15 is formed, thereby potentially increasing the dielectric constant of the high-k layer 15. The interfacial layer 14 may have a thickness of approximately 5 Å to approximately 13 Å.

The high-k layer 15 includes a material having a high-k constant. The dielectric constant of the high-k layer 15 is higher than the dielectric constant of a silicon oxide, which is approximately 3.9. The high-k layer 15 may have a higher dielectric constant than the interfacial layer 14.

The high-k layer 15 may include a metal oxide, a metal silicate or a metal silicate nitride. The metal oxide may include a hafnium oxide, an aluminum oxide, a lanthanum oxide, a zirconium oxide or a combination thereof. The metal silicate may include hafnium silicate (HfSiO), zirconium silicate (ZrSiO) or a combination thereof. The metal silicate nitride may include a hafnium silicate nitride (HfSiON), a zirconium silicate nitride (ZrSiON), or a combination thereof.

When the high-k layer 15 is formed simultaneously in the PMOS region and the NMOS region, the formation process is simplified. Different materials may be used for the high-k layer 15 in the PMOS region and the NMOS region. The formation process of the high-k layer 15 may include an appropriate material deposition technique. For example, there is a chemical vapor deposition (CVD) method, a low-pressure chemical vapor deposition (LPCVD) method, a plasma-enhanced chemical vapor deposition (PECVD) method, a metal-organic chemical vapor deposition (MOCVD) method, an ionic layer deposition (ALD) method, a plasma enhanced ionic layer deposition (PEALD) method, and so on. To uniformly form the high-k layer 15, the ALD method or the PEALD method may be used. The high-k layer 15 may be formed to a thickness of approximately 15 Å to approximately 60 Å.

Hereafter, a metal silicate nitride may be used for the high-k layer 15 in an embodiment of the present invention. To form the metal silicate nitride as the high-k layer 15, a metal silicate is formed and then a nitridation process and an annealing process may be performed sequentially on the metal silicate. The nitrdation process includes a plasma nitridation process. Therefore, nitrogen is injected into the high-k layer 15. For example, when the high-k layer 15 is a hafnium silicate nitride, hafnium silicate (HfSiO) is formed, and then the hafnium silicate nitride (HfSiON) may be formed through the nitridation process. As described above, when nitrogen is implanted into the metal silicate, the dielectric constant may increase and the crystallization of the metal silicate may be restrained during a subsequent thermal process. The plasma nitridation process may be performed at a temperature of approximately 400° C. to approximately 600° C. Also, the plasma nitridation process may use a combination of argon (Ar) and nitrogen gas ($N_2$) as reaction gas. The metal silicate becomes the metal silicate nitride through the plasma nitridation process. Gases other than nitrogen gas ($N_2$) may be used as a source of nitrogen for the plasma nitridation process. For example, ammonia ($NH_3$) and hydrazine ($N_2H_4$) may be used as the source of nitrogen. After the nitridation process is performed, the annealing process is performed. Since the annealing process is performed after the nitridation process, the annealing process is referred to as a post nitridation anneal (PNA). The metal silicate is in a nitrogen-rich state on the surface formed through the plasma nitridation process. When the annealing process is performed, nitrogen ions injected into the metal silicate may spread uniformly inside of the metal silicate. The annealing process may be performed in an atmosphere of nitrogen gas ($N_2$) at a temperature of approximately 500° C. to approximately 900° C.

As described above, the metal silicate nitride may be formed as the high-k layer 15 through a series of formation, nitridation and annealing processes of the metal silicate. When the high-k layer 15 is formed using the metal silicate nitride, the dielectric constant may increase, and crystallization may be restrained during a subsequent thermal process. The high-k layer 15 may become a gate dielectric layer.

A capping layer 16A is formed over the high-k layer 15. The capping layer 16A includes a material for controlling an electron trapped by an oxygen vacancy in the high-k layer 15. The capping layer 16A may contain a lanthanide element. The capping layer 16A may include a lanthanum oxide. The capping layer 16A is formed simultaneously in the upper portion of the substrate 11 in the PMOS region and the NMOS region. The capping layer 16A is referred to as a high-k cap for capping a high-k layer. The capping layer 16A has a first portion and a second portion. The first portion is formed over the substrate 11 in the NMOS region, and the second portion is formed over the substrate 11 in the PMOS region.

A first mask layer 16M is formed over the capping layer 16A. The first mask layer 16M masks a portion of the capping layer 16A. For example, the capping layer 16A in the PMOS region between the PMOS region and the NMOS region opens. The first mask layer 16M may include a photoresist.

Figure 2B:
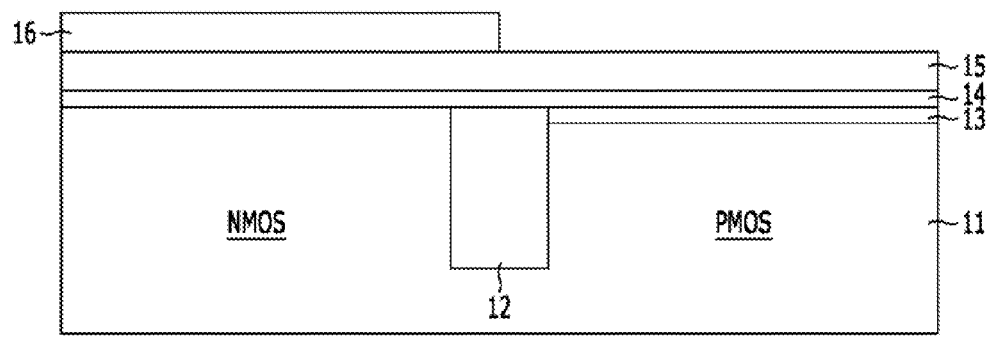

Referring to FIG. 2B, the second portion of the capping layer 16A shown in FIG. 2A, is removed. For example, the capping layer 16A is removed by using the first mask layer 16M as an etch barrier in the PMOS region. As a result, the first portion of the capping layer 16A remains. For example, a capping layer 16 remains just in the NMOS region. Additionally, as the second portion of the capping layer 16A is removed, the high-k layer 15 is exposed in the PMOS region.

Figure 2C:
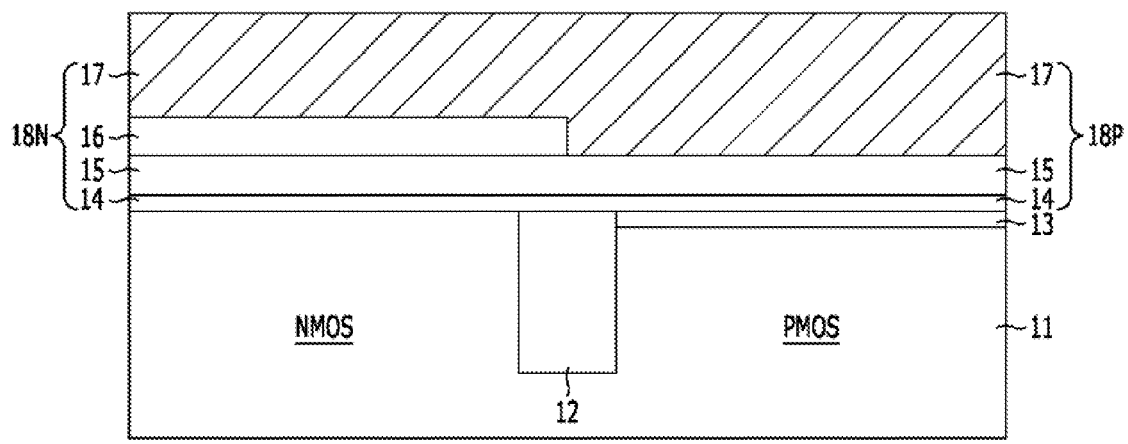

Referring to FIG. 2C, the first mask layer 16M, shown in FIG. 2A, is removed.

A gate conductive layer 17 is formed. The gate conductive layer 17 is formed of the same material in the NMOS region and the PMOS region. The gate conductive layer 17 is simultaneously formed over both of the high-k layer 15 in the PMOS region and the capping layer 16 in the NMOS region. The upper surface of the gate conductive layer 17 may be planarized. The gate conductive layer 17 includes a metal, a metal nitride or a metal silicide. The gate conductive layer 17 may include a titanium nitride (TiN). The gate conductive layer 17 may be formed of the titanium nitride (TiN) having a chemical stoichiometric ratio. The chemical stoichiometric ratio of titanium and nitrogen in the titanium nitride (TiN) is approximately one to one (1:1). The titanium nitride (TiN) may be formed using a physical vapor deposition (PVD) method. Therefore, the chemical stoichiometric ratio of titanium and nitrogen in the titanium nitride (TiN) may be easily controlled.

A preliminary first gate stack layer 18N and a preliminary second gate stack layer 18P are formed by the gate conductive layer 17. The preliminary first gate stack layer 18N is formed over the substrate 11 in the NMOS region. The preliminary second gate stack layer 18P is formed over the substrate 11 in the PMOS region. The preliminary first gate stack layer 18N includes the interfacial layer 14, the high-k layer 15, the capping layer 16 and the gate conductive layer 17. The preliminary second gate stack layer 18P includes the interfacial layer 14, the high-k layer 15 and the gate conductive layer 17. The preliminary first gate stack layer 18N has the capping layer 16, and the preliminary second gate stack layer 18P does not have the capping layer 16. The thickness of the gate conductive layer 17 may be different in the preliminary first gate stack layer 18N and the preliminary second gate stack layer 18P. For example, the gate conductive layer 17 formed in the preliminary first gate stack layer 18N may be thinner than the gate conductive layer 17 formed in the preliminary second gate stack layer 18P. Their work functions may be different due to the difference in the thickness of the gate conductive layer 17. The difference in the thickness of the gate conductive layer 17 may be obtained from the capping layer 16.

Figure 2D:
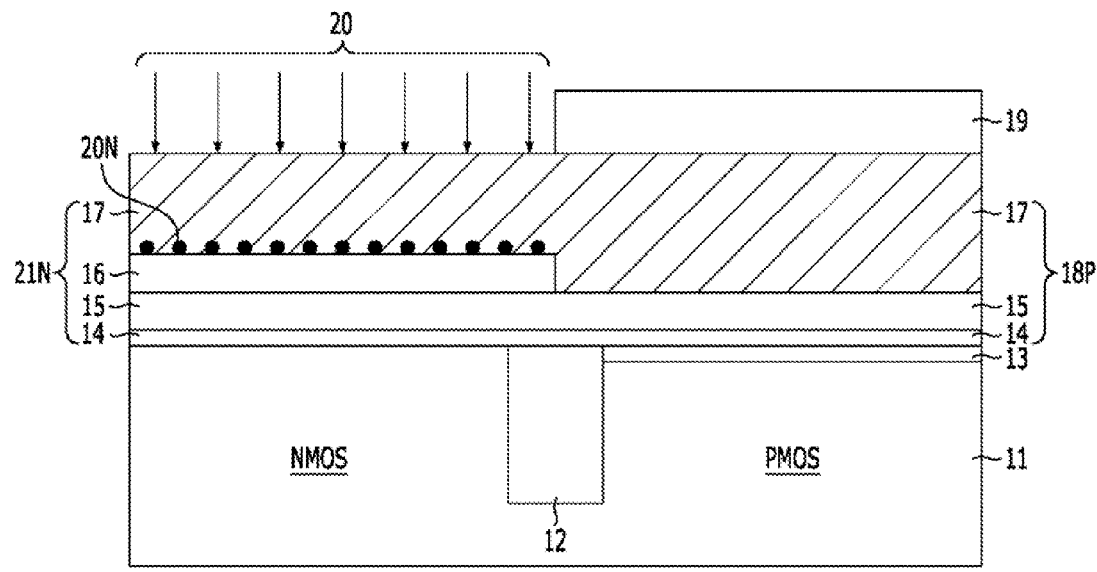

Referring to FIG. 2D, a second mask layer 19 is formed. The preliminary second gate stack layer 18P is masked by the second mask layer 19, and the preliminary first gate stack layer 18N, shown in FIG. 2C, opens. The second mask layer 19 may include a photoresist.

A first chemical species 20N is introduced to the preliminary first gate stack layer 18N. To introduce the first chemical species 20N, a first ion-implantation 20 may be performed. The first ion-implantation 20 is performed on the preliminary first gate stack layer 18N. While the first ion-implantation 20 is performed, the preliminary second gate stack layer 18P is blocked by the second mask layer 19. The first ion-implantation 20 is performed by implanting the first chemical species 20N or a compound containing the first chemical species 20N. The first chemical species 20N may be disposed at an interface between the gate conductive layer 17 and the capping layer 16. Also, the first chemical species 20N may be disposed inside of the gate conductive layer 17, the capping layer 16 and the high-k layer 15. The first chemical species 20N may include an element having a first electronegativity. The first electronegativity may have a relatively high electronegativity. The first chemical species 20N may include arsenic (As).

As described above, a first gate stack layer 21N, where the first chemical species 20N is introduced by the first ion-implantation 20, is formed. The first chemical species 20N is not introduced to the preliminary second gate stack layer 18P.

Figure 2E:
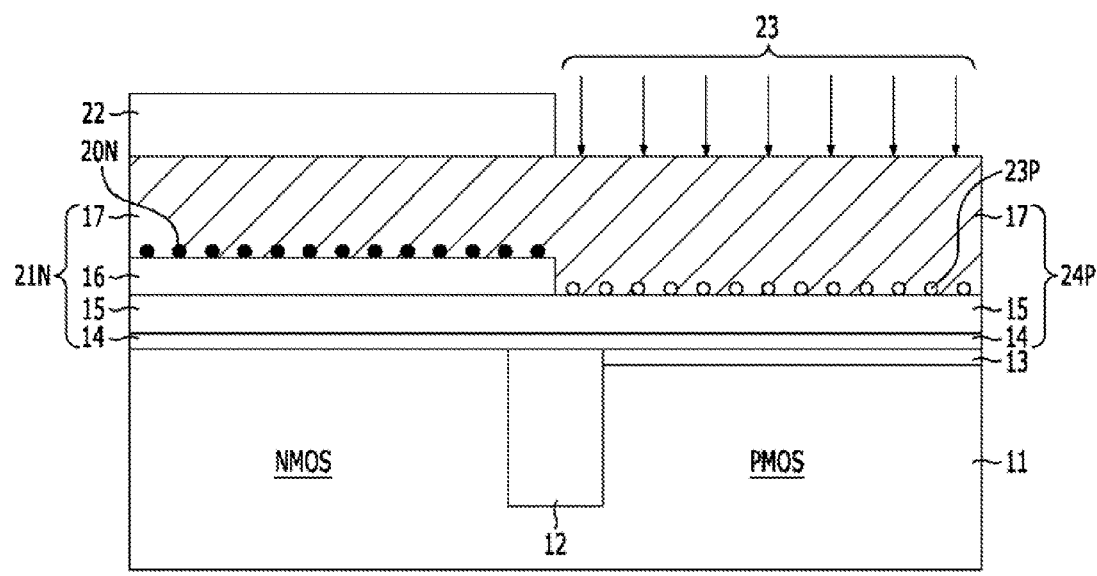

Referring to FIG. 2E, the second mask layer 19, shown in FIG. 2D, is removed.

A third mask layer 22 is formed. The first gate stack layer 21N is masked by the third mask layer 22 and the preliminary second gate stack layer 18P, shown in FIG. 2D, opens.

A second chemical species 23P is introduced to the preliminary second gate stack layer 18P. To introduce the second chemical species 23P, a second ion-implantation 23 may be performed. The second ion-implantation 23 is performed on the preliminary second gate stack layer 18P. While the second ion-implantation 23 is performed, the first gate stack layer 21N is blocked by the third mask layer 22. The second ion-implantation 23 is performed by implanting the second chemical species 23P or a compound containing the second chemical species 23P. The second chemical species 23P may be disposed at the interface between the gate conductive layer 17 and the high-k layer 15. Additionally, the second chemical species 23P may be disposed inside of the gate conductive layer 17 and the high-k layer 15. The second chemical species 23P may include an element having a second electronegativity. The second electronegativity may be relatively low. The second chemical species 23P may include aluminum (Al).

A second gate stack layer 24P, where the second chemical species 23P is introduced through the second ion-implantation 23, is formed. The second chemical species 23P is not introduced to the first gate stack layer 21N.

As described above, the first gate stack layer 21N and the second chemical species 23P, where the first chemical species 20N and the second chemical species 23P have different electronegativities, are formed by introducing the first ion-implantation 20 and the second ion-implantation 23, respectively. For example, the first gate stack layer 21N, where the first chemical species 20N is introduced, is formed over the substrate 11 in the NMOS region. The second gate stack layer 24P, where the second chemical species 23P is introduced, is formed over the substrate 11 in the PMOS region. The electronegativity of the first chemical species 20N is relatively high. The electronegativity of the second chemical species 23N is relatively low. The electronegativity of the first chemical species 20N is higher than the electronegativity of the second chemical species 23P.

Figure 2F:
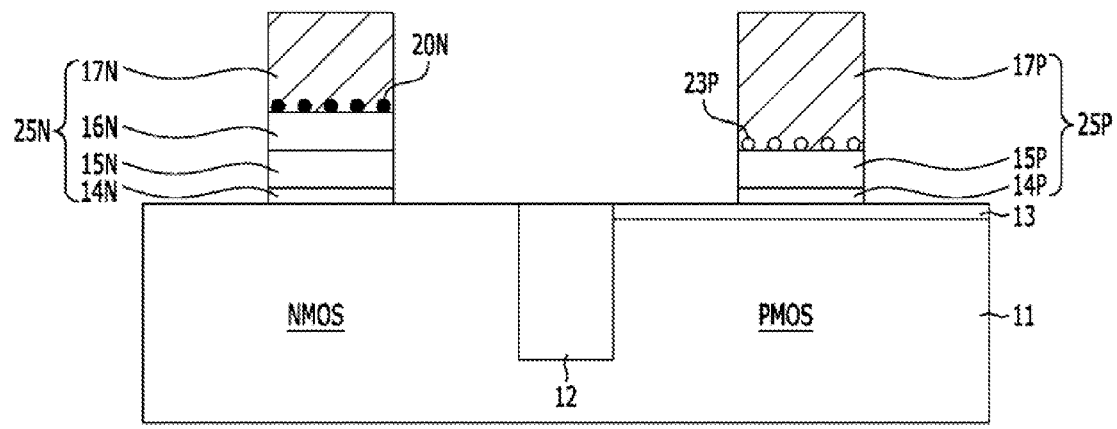

Referring to FIG. 2F, a gate patterning process is performed using a gate mask layer (not shown). For example, a first gate structure 25N is formed over the substrate 11 in the NMOS region by etching the first gate stack layer 21N shown in FIG. 2E. A second gate structure 25P is formed over the substrate 11 in the PMOS region by etching the second gate stack layer 24P shown in FIG. 2E. The first gate structure 25N and the second gate structure 25P may be formed by being patterned simultaneously using one gate mask layer.

The first gate structure 25N may be formed by sequentially stacking a first interfacial layer 14N, a first high-k layer 15N, a capping layer 16N, and a first metal gate electrode 17N. The first chemical species 20N is introduced to the first gate structure 25N.

The second gate structure 25P may be formed by sequentially stacking a second interfacial layer 14P, a second high-k layer 15P and a second metal gate electrode 17P. The second chemical species 23P is introduced to the second gate structure 25P.

Other formation processes subsequent to the gate patterning process, which is well known to those skilled in the art, may be performed.

Figure 2G:
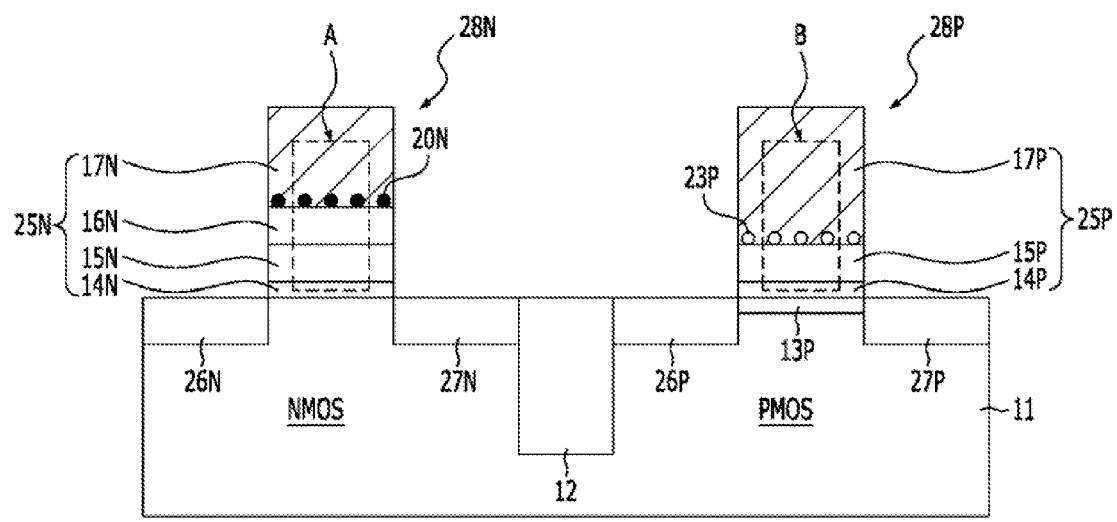

Referring to FIG. 2G, an ion-implantation and an active annealing process for forming a source region and a drain region may be performed. The source and drain regions include first source and drain regions 26N and 27N and second source and drain regions 26P and 27P. The first source and drain regions 26N and 27N and the second source and drain regions 26P and 27P may be formed to have a lightly doped drain (LDD) structure.

The first source and drain regions 26N and 27N are formed over the substrate 11 in the NMOS region. The second source and drain regions 26P and 27P are formed over the substrate 11 in the PMOS region. The first source and drain regions 26N and 27N are formed by the ion-implantation of an N-type dopant. The second source and drain regions 26P and 27P are formed by ion-implanting a P-type dopant. A germanium-containing channel region 13P is formed below the second gate structure 25P. The germanium-containing channel region 13P is formed by the germanium-containing layer 13 between the second source region 26P and the second drain region 27P.

A first transistor 28N and a second transistor 28P are formed based on the formation of the first source and drain regions 26N and 27N and the second source and drain regions 26P and 27P. The first transistor 28N includes the first gate structure 25N and the first source and drain regions 26N and 27N. The second transistor 28P includes the second gate structure 25P and the second source and drain regions 26P and 27P. The second transistor 28P further includes the germanium-containing channel region 13P. The first gate structure 25N includes the capping layer 16N, and the second gate structure 25P does not include a capping layer. The first chemical species 20N is introduced to the first gate structure 25N, and the second chemical species 23P is introduced to the second gate structure 25P. The first chemical species 20N and the second chemical species 23P may spread through the active annealing process.

The threshold voltage of the first transistor 28N is controlled by reducing the work function of the first metal gate electrode 17N by the first chemical species 20N. Additionally, the threshold voltage may be easily controlled through a dipole induced by the first chemical species 20N and the capping layer 16N.

The threshold voltage of the second transistor 28P is controlled by means of a work function of the second metal gate electrode 17P increased by the second chemical species 23P and a dipole formed between the second metal gate electrode 17P and the second high-k layer 15P. Additionally, the threshold voltage may be controlled by the germanium-containing channel region 13P.

The first transistor 28N may include a PMOSFET. The second transistor 28P may include an NMOSFET. Therefore, a CMOSFET including the NMOSFET and the PMOSFET is formed.

In an embodiment of the present invention, it may be easy to independently control threshold voltages of the NMOSFET and the PMOSFET during an integrated process of the CMOSFET.

Figure 3A:
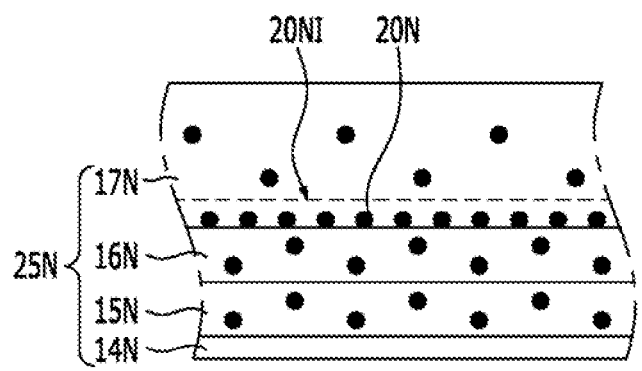
FIG. 3A illustrates a magnified view of an "A" portion shown in FIG. 2G.
Figure 3B:
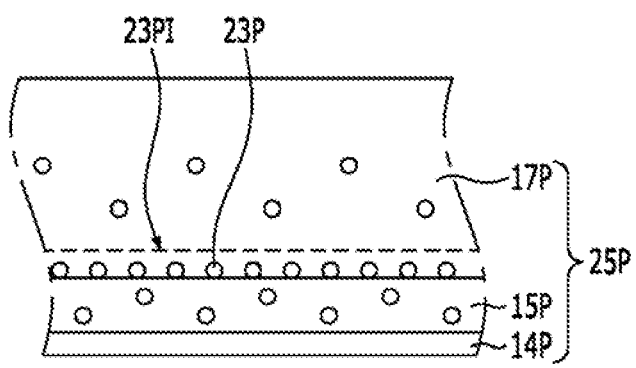
FIG. 3B illustrates a magnified view of a "B" portion shown in FIG. 2G.

FIG. 3A illustrates a magnified view of an "A" portion shown in FIG. 2G. FIG. 3B illustrates a magnified view of a "B" portion shown in FIG. 2G.

Referring to FIG. 3A, the first chemical species 20N may be disposed at the interface between the first metal gate electrode 17N and the capping layer 16N. The first chemical species 20N may form a layer. For example, an introduction layer 20NI of the first chemical species 20N may be formed on the interface between the first metal gate electrode 17N and the capping layer 16N. In another embodiment of the present invention, the first chemical species 20N may exist at random or in combination with other chemical species. The chemical species may include metal elements of the first metal gate electrode 17N and the capping layer 16N. Additionally, a portion of the first chemical species 20N may be disposed inside of the first metal gate electrode 17N, the capping layer 16N and the first high-k layer 15N.

Referring to FIG. 3B, the second chemical species 23P may be disposed at the interface between the second metal gate electrode 17P and the second high-k layer 15P. The second chemical species 23P may form a layer. For example, an introduction layer 23PI of the second chemical species 23P may be formed on the interface between the second metal gate electrode 17P and the second high-k layer 15P. In another embodiment of the present invention, the second chemical species 23P may exist at random in combination with other chemical species. The chemical species may include metal elements of the second metal gate electrode 17P and the second high-k layer 15P. Also, a portion of the second chemical species 23P may be disposed inside of the second metal gate electrode 17P and the second high-k layer 15P.

Figure 4:
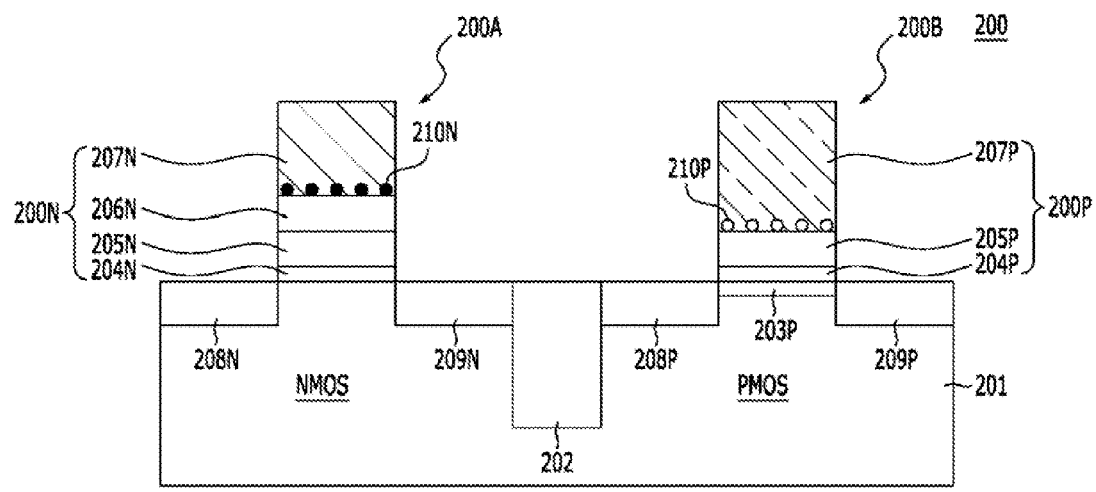
FIG. 4 is a cross-sectional view illustrating a semiconductor device in accordance with a second embodiment of the present invention.

FIG. 4 is a cross-sectional view illustrating a semiconductor device 200 in accordance with a second embodiment of the present invention.

Referring to FIG. 4, the semiconductor device 200 includes a first transistor 200A and a second transistor 200B. The first transistor 200A includes an N-channel transistor NMOS. The second transistor 200B includes a P-channel transistor PMOS. The first transistor 200A and the second transistor 200B are isolated by an isolation region 202.

The first transistor 200A includes a first gate structure 200N, a first source region 208N and a first drain region 209N. The first gate structure 200N is formed over a substrate 201. The first source region 208N and the first drain region 209N are formed in the substrate 201. The first gate structure 200N includes a first interfacial layer 204N, a first high-k layer 205N, a capping layer 206N, and a first work function metal gate electrode 207N. The first gate structure 200N includes a first chemical species 210N having a first electonegativity. The first chemical species 210N may include arsenic (As). The first chemical species 210N may be disposed at the interface between the first work function metal gate electrode 207N and the capping layer 206N. Also, the first chemical species 210N may be disposed in the first high-k layer 205N, the capping layer 206N and the first work function metal gate electrode 207N. A threshold voltage of the first transistor 200A is controlled based on the work function of the first chemical species 210N. Furthermore, the threshold voltage may be additionally controlled through a dipole induced by the first chemical species 210N and the capping layer 206N.

The first work function metal gate electrode 207N may include a material having an N-type work function before the first chemical species 210N is introduced. The N-type work function material includes a titanium-rich titanium nitride. The titanium-rich titanium nitride is a titanium nitride which has more titanium than the chemical stoichiometric ratio. The N-type work function is smaller than the mid-gap work function of silicon. The work function may be reduced as the first chemical species 210N is introduced to the material having the N-type work function.

The second transistor 200B includes a second gate structure 200P, a second source region 208P and a second drain region 209P. The second gate structure 200P is formed over the substrate 201. The second source region 208P and the second drain region 209P are formed in the substrate 201. The second gate structure 200P includes a second interfacial layer 204P, a second high-k layer 205P and a second work function metal gate electrode 207P. The second gate structure 200P includes a second chemical species 210P having a second electonegativity. The second chemical species 210P may be disposed at the interface between the second work function metal gate electrode 207P and the second high-k layer 205P. Additionally, the second chemical species 210P may be disposed in the second high-k layer 205P and the second work function metal gate electrode 207P. The threshold voltage of the second transistor 200B is controlled based on the control of the work function by the second chemical species 210P. Furthermore, the threshold voltage may be controlled through a dipole induced by the second chemical species 210P. The threshold voltage of the second transistor 200B is further controlled by a germanium-containing channel region 203P.

The second work function metal gate electrode 207P and the first work function metal gate electrode 207N have different work functions. The second work function metal gate electrode 207P may include a material having a P-type work function before the second chemical species 210P is introduced. The second work function metal gate electrode 207P includes a nitrogen-rich titanium nitride (N-rich TiN) or a titanium-aluminum nitride (TiAlN). The work function may greatly increase as the second chemical species 210P is introduced to the material having the P-type work function.

The first and second interfacial layers 204N and 204P may be formed of the same material as the interfacial layers 104N and 104P which are described in the first embodiment of the present invention.

The first and second high-k layers 205N and 205P may be formed of the same material as the high-k layers 105N and 105P which are described in the first embodiment of the present invention.

The capping layer 206N may be formed of the same material as the capping layer 106N which is described in the first embodiment of the present invention. For example, the capping layer 206N may include a lanthanum oxide.

Although not illustrated, low resistance layers may be formed over the first work function metal gate electrode 207N and the second work function metal gate electrode 207P, respectively. The low resistance layer may include a metal silicide. The low resistance layer reduces the resistance of the first gate structure 200N and the second gate structure 200P. The low resistance layer includes a silicide layer containing platinum and nickel.

The first source and drain regions 208N and 209N may be doped with an N-type impurity. The second source and drain regions 208P and 209P may be doped with a P-type impurity.

Referring to FIG. 4, the threshold voltage of the N-channel transistor NMOS and the threshold voltage of the P-channel transistor PMOS may be independently controlled.

Figure 5A:
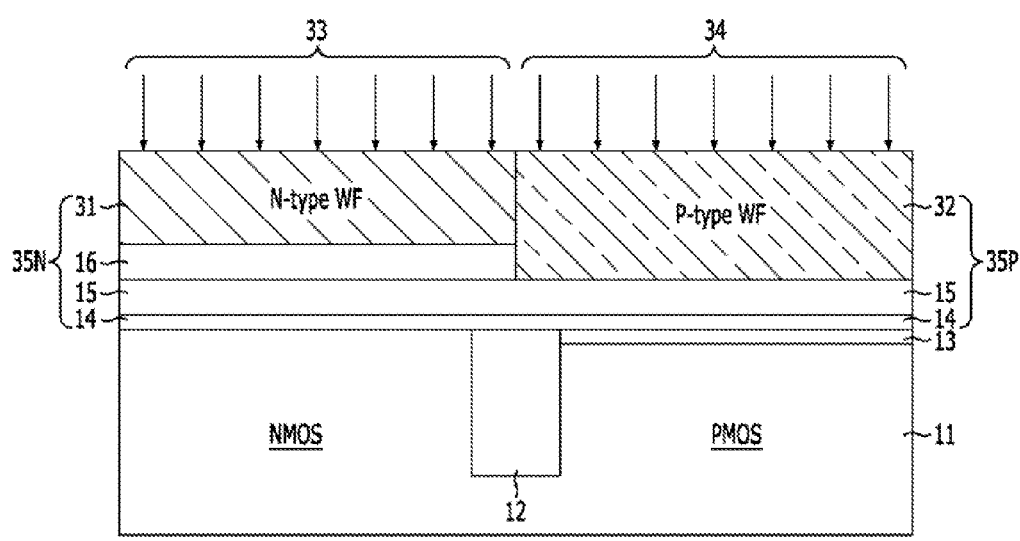
FIGS. 5A to 5C are cross-sectional views exemplarily illustrating various methods of fabricating the semiconductor device shown in FIG. 4.
Figure 5B:
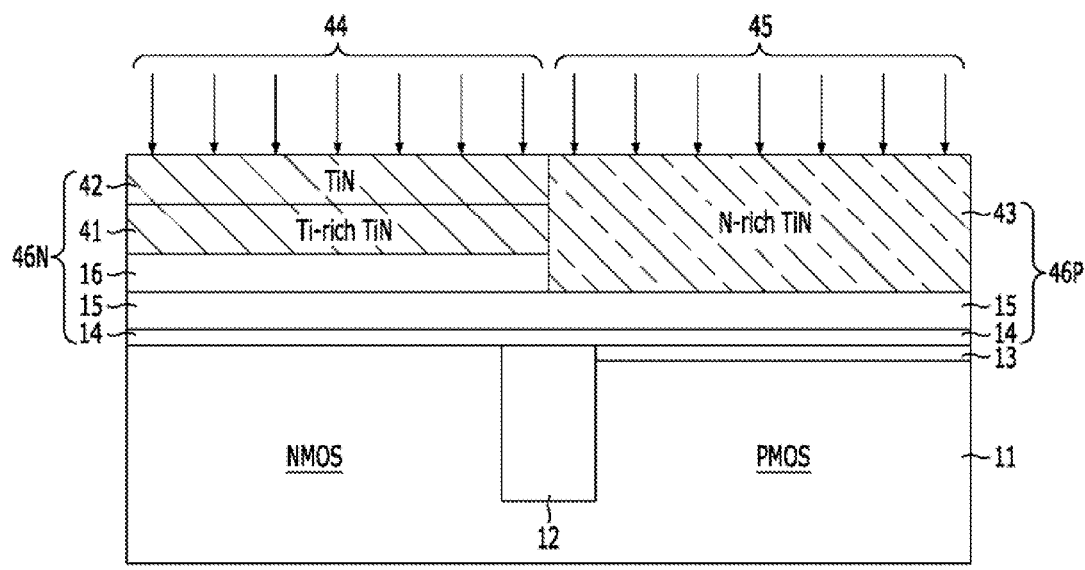
Figure 5C:
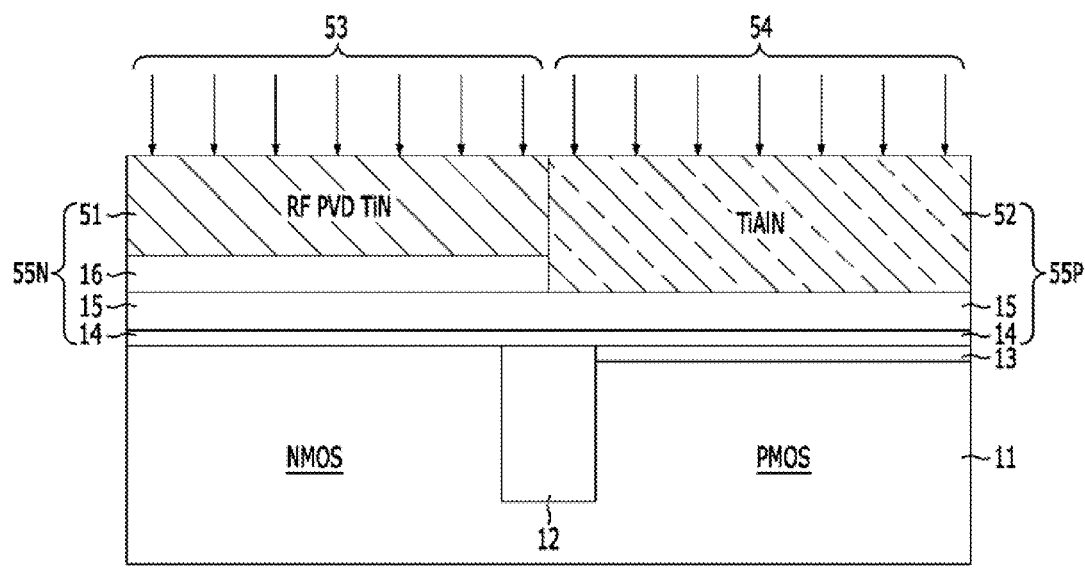

FIGS. 5A to 5C are cross-sectional views exemplarily illustrating various methods of fabricating the semiconductor device shown in FIG. 4. The other methods, except for a method for forming a gate conductive layer, are referred to in the description of the first embodiment of the present invention.

Referring to FIG. 5A, a germanium-containing layer 13, an interfacial layer 14, a high-k layer 15 and a capping layer 16 are formed. The capping layer 16 is formed in an NMOS region. An N-type work function metal layer 31 and a P-type work function metal layer 32 are formed. The N-type work function metal layer 31 is formed in the NMOS region. The P-type work function metal layer 32 is formed in a PMOS region.

A first ion-implantation 33 and a second ion-implantation 34 are performed, respectively. The first ion-implantation 33 is performed in the NMOS region. The second ion-implantation 34 is performed in the PMOS region. The first ion-implantation 33 indicates that arsenic (As) is implanted. The second ion-implantation 34 indicates that aluminum (Al) is implanted. While the first ion-implantation 33 is performed, the P-type work function metal layer 32 is masked. While the second ion-implantation 34 is performed, the N-type work function metal layer 31 is masked.

A first gate stack layer 35N where arsenic ions are introduced by the first ion-implantation 33 is formed. A second stack layer 35P where aluminum ions are introduced by the second ion-implantation 34 is formed.

Referring to FIG. 5B, the germanium-containing layer 13, the interfacial layer 14, the high-k layer 15 and the capping layer 16 are formed. A first titanium nitride layer 41, a second titanium nitride layer 42, and a third titanium nitride layer 43 are formed. The first titanium nitride layer 41 and the second titanium nitride layer 42 are formed in the NMOS region. The third titanium nitride layer 43 is formed in the PMOS region. The second titanium nitride layer 42 is formed over the first titanium nitride layer 41. The first titanium nitride layer 41 includes a titanium-rich titanium nitride (Ti-rich TiN). The second titanium nitride layer 42 includes a chemical stoichiometric titanium nitride. The third titanium nitride layer 43 includes a nitrogen-rich titanium nitride (N-rich TiN). The titanium-rich titanium nitride (Ti-rich TiN) has more titanium than the chemical stoichiometric titanium nitride. The nitrogen-rich titanium nitride (N-rich TiN) has more nitrogen than the chemical stoichiometric titanium nitride. The titanium-rich titanium nitride (Ti-rich TiN) has an N-type work function. The nitrogen-rich titanium nitride (N-rich TiN) has a P-type work function.

A first ion-implantation 44 and a second ion-implantation 45 are performed, respectively. The first ion-implantation 44 is performed in the NMOS region. The second ion-implantation 45 is performed in the PMOS region. The first ion-implantation 44 indicates that arsenic (As) is implanted. The second ion-implantation indicates that aluminum (Al) is implanted. While the first ion-implantation 44 is performed, the third titanium nitride layer 43 is masked. While the second ion-implantation 45 is performed, the first titanium nitride layer 41 and the second titanium nitride layer 42 are masked.

A first gate stack layer 46N where arsenic ions are introduced by the first ion-implantation 44 is formed. A second stack layer 46P where aluminum ions are introduced by the second ion-implantation 45 is formed.

Referring to FIG. 5C, a germanium-containing layer 13, an interfacial layer 14, a high-k layer 15 and a capping layer 16 are formed. A titanium nitride layer 51 and a titanium aluminum nitride layer 52 are formed. The titanium nitride layer 51 is formed in the NMOS region. The titanium aluminum nitride layer 52 is formed in the PMOS region. The titanium nitride layer 51 is formed by an RF PVD, which is referred to as RF PVD TiN. The RF PVD TiN has an N-type work function. The titanium aluminum nitride layer 52 has a P-type work function.

A first ion-implantation 53 and a second ion-implantation 54 are performed. The first ion-implantation 53 is performed in the NMOS region. The second ion-implantation 54 is performed in the PMOS region. The first ion-implantation 53 indicates that arsenic (As) is implanted. The second ion-implantation 54 indicates that aluminum (Al) is implanted. While the first ion-implantation 53 is performed, the titanium aluminum nitride layer 52 is masked. While the second ion-implantation 54 is performed, the titanium nitride layer 51 is masked.

A first gate stack layer 55N where arsenic ions are introduced by the first ion-implantation 53 is formed. A second stack layer 55P where aluminum ions are introduced by the second ion-implantation 54 is formed.

Figure 6:
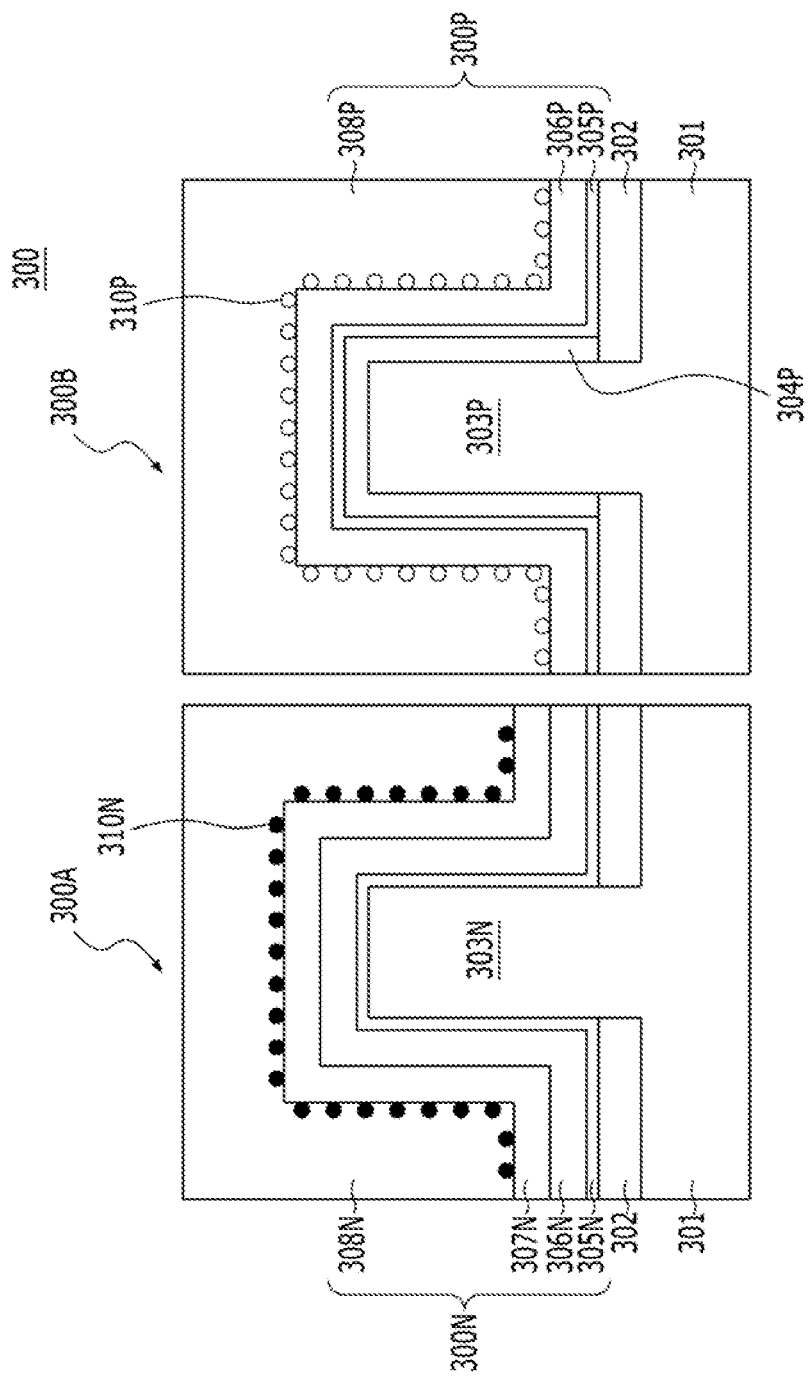
FIG. 6 is a cross-sectional view illustrating a semiconductor device in accordance with a third embodiment of the present invention.

FIG. 6 is a cross-sectional view illustrating a semiconductor device 300 in accordance with a third embodiment of the present invention.

Referring to FIG. 6, the semiconductor device 300 includes a first transistor 300A and a second transistor 300B, which are fin-type transistors.

The first transistor 300A includes a first fin-channel region 303N formed over a substrate 301. The first fin-channel region 303N protrudes through an isolation region 302. A first interfacial layer 305N, a first high-k layer 306N, a capping layer 307N, and a first metal gate electrode 308N are formed over the first fin-channel region 303N. A first chemical species 310N is disposed at the interface between the first metal gate electrode 308N and the capping layer 307N. The first chemical species 310N includes arsenic (As).

The second transistor 300B includes a second fin-channel region 303P formed over the substrate 301. The second fin-channel region 303P protrudes through an isolation region 302. A germanium-containing channel region 304P is formed on the sidewalls and in the upper portion of the second fin-channel region 303P. A second interfacial layer 305P, a second high-k layer 306P and a second metal gate electrode 308P are formed over the germanium-containing channel region 304P. A second chemical species 310P is disposed at the interface between the second metal gate electrode 308P and the second high-k layer 306P. The second chemical species 310P includes aluminum (Al).

The first metal gate electrode 308N and the second metal gate electrode 308P may be formed of the same material as the metal gate electrodes in the aforementioned embodiments.

The transistors in accordance with the embodiments of the present invention may be integrated into an integrated circuit.

The transistors in accordance with the embodiments of the present invention may be applied to a transistor circuit including transistors serving diverse purposes, e.g., an IGFET, a HEMT, a power transistor, TFT, etc.

The transistors and the transistor circuit in accordance with the embodiments of the present invention may be embedded in an electronic device. The electronic device may include a memory device and a non-memory device. The memory device may include a SRAM, a DRAM, a flash memory, a MRAM, a ReRAM, a STTRAM, a FeRAM, etc. The non-memory device includes a logic circuit. The logic circuit may include a sense amplifier, a decoder, an input/output circuit, etc. for controlling the memory device. Additionally, the logic circuit may include a variety of circuits. For example, the logic circuit includes a microprocessor, an AP of a mobile device, etc. Furthermore, the non-memory device includes a logic gate such as a NAND gate, a driver circuit for a display device, a power semiconductor device, such as a power management integrated circuit, etc. The electronic device may include a computing system, an image sensor, a camera, a mobile device, a display device, a sensor, a medical device, a photoelectronic device, a radio frequency identification (RFID), a solar battery, an automobile semiconductor device, a rolling stock semiconductor device, an aircraft semiconductor device, etc.

Hereafter, various examples will be described in which the transistors in accordance with the embodiments of the present invention are applied.

FIGS. 7A to 7D exemplarily illustrate integrated circuits including the transistors in accordance with the embodiments of the present invention.

Figure 7A:
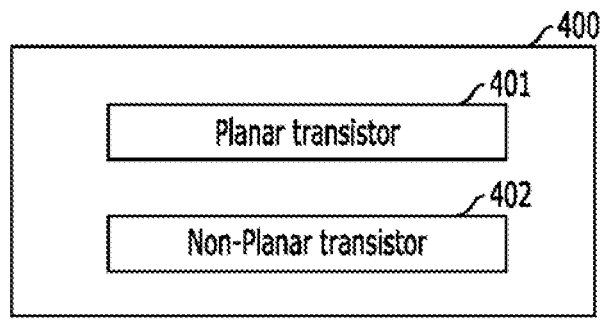
FIGS. 7A to 7D exemplarily illustrate integrated circuits including the transistors in accordance with the embodiments of the present invention.

An integrated circuit 400 illustrated in FIG. 7A includes a plurality of planar transistors 401 and a plurality of non-planar transistors 402.

Figure 7B:
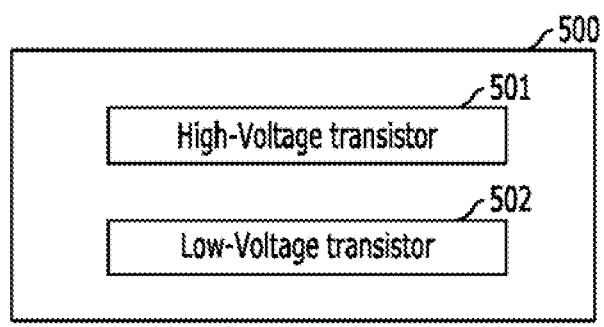

The integrated circuit 500 illustrated in FIG. 7B includes a plurality of high-voltage transistors 501 and a plurality of low-voltage transistors 502.

Figure 7C:
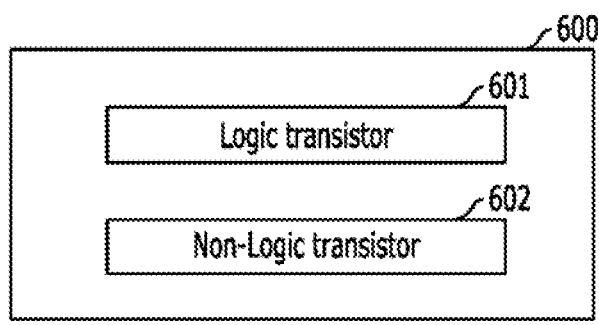

The integrated circuit 600 illustrated in FIG. 7C includes a plurality of logic transistors 601 and a plurality of non-logic transistors 602.

Figure 7D:
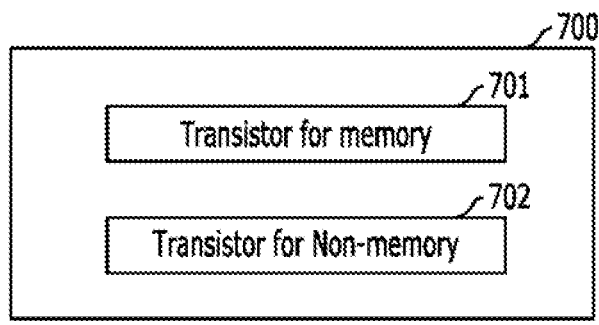

The integrated circuit 700 illustrated in FIG. 7D includes a transistor for a memory device 701 and a transistor for a non-memory device 702.

The transistors of the aforementioned integrated circuits 400, 500, 600 and 700 may include the transistors in accordance with the embodiments of the present invention. In a NMOSFET, the gate structure includes a high-k layer, a capping layer over the high-k layer and a metal gate electrode over the capping layer, with arsenic (As) introduced therein. In a PMOSFET, the gate structure includes a high-k layer and a metal gate electrode over the high-k layer, with aluminum (Al) introduced therein.

As a result, the performance of the integrated circuits 400, 500, 600 and 700 may be improved.

Figure 8:
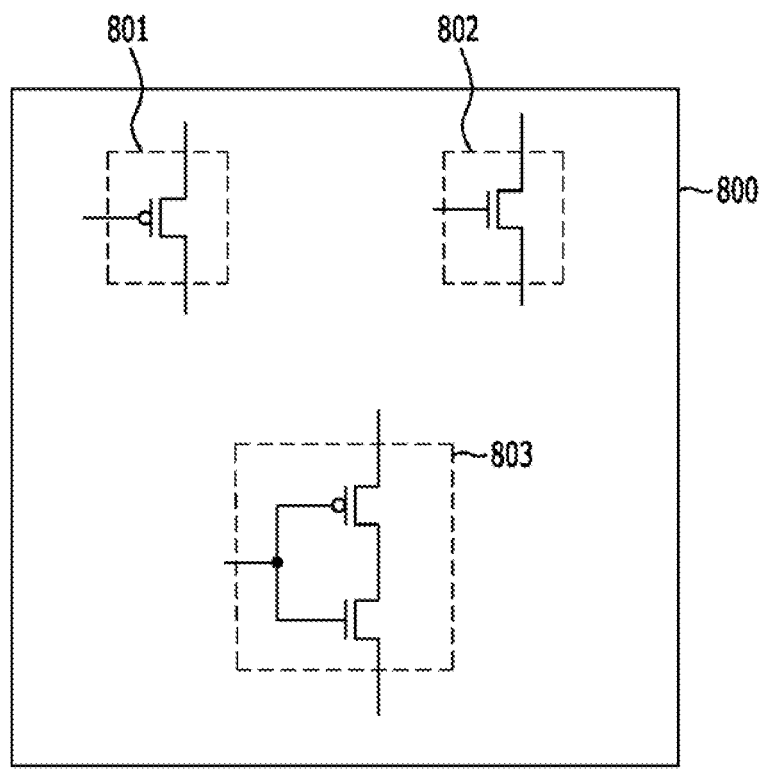
FIG. 8 illustrates an electronic device including the transistors in accordance with the embodiments of the present invention.

FIG. 8 illustrates an electronic device including the transistors in accordance with the embodiments of the present invention.

Referring to FIG. 8, an electronic device 800 may include a plurality of PMOSFETs 801, a plurality of NMOSFETs 802 and a plurality of CMOSFETs 803. Each PMOSFET 801, NMOSFET 802 and CMOSFET 803 may include the PMOSFET, NMOSFET and CMOSFET in accordance with the embodiments of the present invention. A gate structure in the NMOSFET 802 includes a high-k layer, a capping layer over the high-k layer and a metal gate electrode over the capping layer, with arsenic (As) introduced therein. A gate structure in the PMOSFET 801 includes a high-k layer and a metal gate electrode over the high-k layer, with aluminum (Al) introduced therein.

Therefore, the electronic device 800 may realize high-speed operation in an industrial environment in which the electronic devices are being scaled down continuously and include transistors having improved performance.

Figure 9:
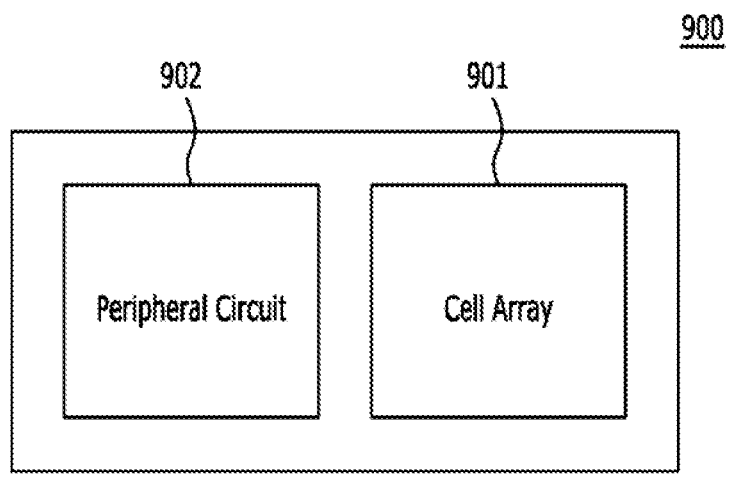
FIG. 9 illustrates a memory device including the transistors in accordance with the embodiments of the present invention.

FIG. 9 illustrates a memory device including the transistors in accordance with the embodiments of the present invention.

Referring to FIG. 9, a memory device 900 may include a memory cell array 901 and a peripheral circuit 902. The peripheral circuit 902 includes a decoder, a sense amplifier, an input/output circuit, etc. The peripheral circuit 902 includes a plurality of transistors. The transistors of the peripheral circuit 902 may include the transistors in accordance with the embodiments of the present invention. In an NMOSFET, a gate structure in the NMOSFET includes a high-k layer, a capping layer over the high-k layer and a metal gate electrode over the capping layer, with arsenic (As) introduced therein. In a PMOSFET, the gate structure includes a high-k layer and a metal gate electrode over the high-k layer, with aluminum (Al) introduced therein.

Consequently, a high-speed operation and a miniaturization of the memory device 900 may be realized.

In accordance with the embodiments of the present invention, a threshold voltage of an N-channel transistor may be easily controlled by a gate structure where arsenic (As) is introduced. Also, the threshold voltage of the N-channel transistor may be further controlled by forming a capping layer between a high-k layer and a metal gate electrode.

In accordance with the embodiments of the present invention, the threshold voltage of a P-channel transistor may be easily controlled by a gate structure where aluminum (Al) is introduced.

In accordance with the embodiments of the present invention, the threshold voltages of the N-channel transistor and the P-channel transistor may be independently controlled during an integrated process of the CMOSFET.

While the present invention has been described with respect to the specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A method of fabricating a semiconductor device, comprising:
   forming a gate stack layer including a high-k layer, a metal-containing layer on a semiconductor substrate having an NMOS region and a PMOS region;
   introducing arsenic to the gate stack layer in the NMOS region;
   introducing aluminum to the gate stack layer in the PMOS region; and
   etching the gate stack layer, where the arsenic and the aluminum are introduced, to form a first gate structure and a second gate structure in the NMOS region and the PMOS region, respectively,
   wherein the gate stack layer in the NMOS region includes a capping layer,
   wherein the capping layer has a lanthanum oxide and is located below the metal-containing layer and over the high-k layer, and
   wherein the gate stack layer in the PMOS region does not include the capping layer.

2. The method of claim 1, wherein the introducing of the arsenic includes:
   masking the gate stack layer in the PMOS region; and
   ion-implanting the arsenic into the gate stack layer in the NMOS region.

3. The method of claim 1, wherein the introducing of the aluminum includes:
   masking the gate stack layer of the NMOS region; and
   ion-implanting the aluminum into the gate stack layer of the PMOS region.

4. The method of claim 1, wherein, in the etching of the gate stack layers,
   the metal-containing layer of the NMOS region and the metal-containing layer of the PMOS region include the same low-resistance metal.

5. The method of claim 1, wherein in the etching of the gate stack layers, the metal-containing layer in the NMOS region includes an N-type work function metal, and the metal-containing layer in the PMOS region includes a P-type work function metal.

6. The method of claim 5, wherein the N-type work function metal includes a titanium-rich titanium nitride having more titanium than a chemical stoichmetric titanium nitride, and the P-type work function metal includes a nitrogen-rich titanium nitride having more nitrogen than a chemical stoichmetric titanium nitride.

7. The method of claim 5, wherein the N-type work function metal includes a chemical stoichiometric titanium nitride, and the P-type work function metal includes a titanium aluminum nitride.

8. A method of fabricating a semiconductor device, comprising:
preparing a semiconductor substrate having an NMOS region and a PMOS region;
forming a germanium-containing channel region in an upper portion of the semiconductor substrate of the PMOS region;
forming a first gate stack layer including a first high-k layer, a capping layer over the first high-k layer, and a first metal-containing layer over the semiconductor substrate of the NMOS region;
forming a second gate stack layer including a second high-k layer and a second metal-containing layer over the semiconductor substrate of the PMOS region;
introducing arsenic to the first gate stack layer;
introducing aluminum to the second gate stack layer; and
etching the arsenic-introduced first gate stack layer and the aluminum-introduced second gate stack layer to form a first gate structure and a second gate structure in the NMOS region and the PMOS region, respectively.

9. The method of claim 8, wherein the introducing of the arsenic includes:
performing an ion-implantation so that arsenic ions are disposed at an interface between the capping layer and the first metal-containing layer.

10. The method of claim 8, wherein the introducing of the aluminum includes:
performing an ion-implantation so that aluminum ions are disposed at an interface between the second high-k layer and the second metal-containing layer.

11. The method of claim 8, wherein the capping layer includes a lanthanum oxide.

12. The method of claim 8, wherein the first metal-containing layer and the second metal-containing layer include the same low-resistance metal.

13. The method of claim 8, wherein the first metal-containing layer includes an N-type work function metal, and the second metal-containing layer includes a P-type work function metal.

14. The method of claim 8, wherein the first metal-containing layer includes a titanium-rich titanium nitride having more titanium than a chemical stoichmetric titanium nitride, and the second metal-containing layer includes a nitrogen-rich titanium nitride having more nitrogen than a chemical stoichmetric titanium nitride.

15. The method of claim 8, wherein the first metal-containing layer includes a titanium nitride, and the second metal-containing layer includes a titanium aluminum nitride.

16. A semiconductor device, comprising:
an N-channel transistor having a first gate structure over a substrate;
a P-channel transistor having a second gate structure over a substrate; and
a germanium-containing channel region formed below the second gate structure and in an upper portion of the substrate of the P-channel transistor,
wherein the first gate structure includes:
a first high-k layer,
a capping layer including a lanthanum oxide over the first high-k layer,
a first metal gate electrode over the capping layer, and
arsenic ions disposed at an interface between the capping layer and the first metal gate electrode, and
wherein the second gate structure includes:
a second high-k layer,
a second metal gate electrode over the second high-k layer, and
aluminum ions disposed at an interface between the second high-k layer and the second metal gate electrode.

17. The semiconductor device of claim 16, wherein the first metal gate electrode and the second metal gate electrode include the same material.

18. The semiconductor device of claim 16, wherein the first metal gate electrode includes an N-type work function metal, and the second metal gate electrode includes a P-type work function metal.

19. The semiconductor device of claim 16, wherein the N-type work function metal includes a titanium-rich titanium nitride having more titanium than a chemical stoichmetric titanium nitride, and the P-type work function metal includes a nitrogen-rich titanium nitride having more nitrogen than a chemical stoichmetric titanium nitride.

* * * * *